(12) United States Patent
Martin

(10) Patent No.: US 6,707,229 B1
(45) Date of Patent: Mar. 16, 2004

(54) SURFACE ACOUSTIC WAVE FILTER

(75) Inventor: Günter Martin, Dresden (DE)

(73) Assignee: Tele Filter Zweigniederlassung der Dover Germany GmbH, Teltow (DE)

( * ) Notice: Subject to any disclaimer, the term of this patent is extended or adjusted under 35 U.S.C. 154(b) by 33 days.

(21) Appl. No.: 09/980,343

(22) PCT Filed: May 31, 2000

(86) PCT No.: PCT/DE00/01808

§ 371 (c)(1),
(2), (4) Date: Nov. 30, 2001

(87) PCT Pub. No.: WO00/76065

PCT Pub. Date: Dec. 14, 2000

(30) Foreign Application Priority Data

Jun. 3, 1999 (DE) .......................................... 199 25 798
Sep. 6, 1999 (DE) .......................................... 199 43 072

(51) Int. Cl.⁷ .......................... H01L 41/04; H01L 41/08; H01L 41/18; H02N 2/00

(52) U.S. Cl. .............................. 310/313 B; 310/313 R; 310/313 D; 310/311

(58) Field of Search ........................ 310/313 B, 313 D, 310/313 R, 311

(56) References Cited

U.S. PATENT DOCUMENTS

| | | | | |
|---|---|---|---|---|
| 4,746,882 A | * | 5/1988 | Solie | 333/196 |
| 4,878,036 A | * | 10/1989 | Yatsuda et al. | 333/195 |
| 4,908,542 A | * | 3/1990 | Solie | 310/313 B |
| 5,818,310 A | | 10/1998 | Solie | |
| 5,831,492 A | * | 11/1998 | Solie | 333/193 |
| 5,831,494 A | * | 11/1998 | Solie | 333/193 |
| 6,023,122 A | * | 2/2000 | Liu et al. | 310/313 B |

FOREIGN PATENT DOCUMENTS

| | | |
|---|---|---|
| DE | 25 24 649 | 9/1976 |
| DE | 26 56 154 | 7/1977 |
| GB | 2 193 060 | 1/1988 |
| WO | WO97/10646 | 3/1997 |

OTHER PUBLICATIONS

Yatsuda, H., Design techniques for saw filters using slanted finger interdigital transducers, Mar. 1997, IEEE transactions on ultrasonics, ferroelectrics, and frequency control, vol. 44, No. 2, pp. 453–459.*

Ventura et al. (1994) "A New Concept in SPUDT Design: the RSPUDT (Resonant SPUDT)", IEEE Ultrasonics Symposium Proceedings, pp. 1–6.

* cited by examiner

Primary Examiner—Thomas M. Dougherty
Assistant Examiner—J. Aguirrechea
(74) Attorney, Agent, or Firm—Collard & Roe, D.C.

(57) ABSTRACT

The invention aims at modifying SPUDT-type surface acoustic wave filters in such a way that the wideband filter can be produced with lower insertion loss and a small form factor without substantially enlarging layout. According to the invention, this is achieved by combining the following characteristics: a) the totality of fingers (231–233; 331–333) of each transducer (2; 3) forms a tapering structure and b) the widths and the positions of the fingers are chosen in such a way that the waves reflected on the fingers (231–233; 331–333) together with the waves regenerated by the corresponding source and load resistance (8; 9) result in an lengthening of the impulse response of the filter, which reduces form factor and/or bandwidth. The invention can be used in surface acoustic wave-based components such as wideband bandpass filters and delay lines.

22 Claims, 1 Drawing Sheet

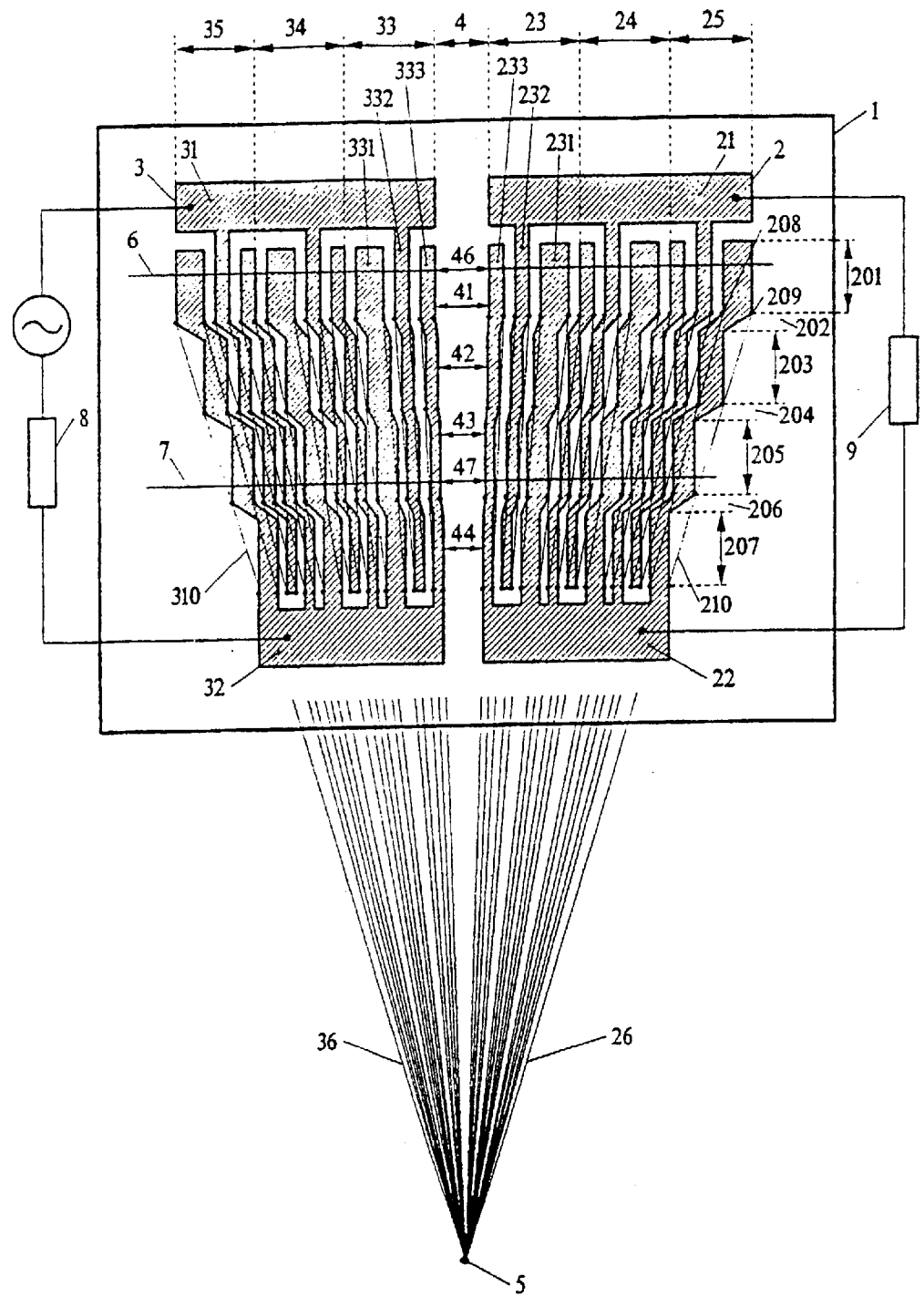

SURFACE ACOUSTIC WAVE FILTER

CROSS REFERENCE TO RELATED APPLICATIONS

Applicant claims priority under 35 U.S.C. §119 of German Application Nos. 199 25 798.1 and 199 43 072.1 filed Jun. 3, 1999 and Sep. 6, 1999, respectively. Applicant also claims priority under 35 U.S.C. §120 of PCT/DE00/01808 filed May 31, 2000. The international application under PCT article 21(2) was not published in English.

TECHNICAL FIELD

The invention relates to objects that can be used and employed in a useful manner in the field of electric engineering and electronics, where structural components based on acoustic surface waves such as wideband bandpass filters and delay lines can be used and employed in a useful manner.

STATE OF THE ART

Transducers are known for acoustic surface waves in connection with which two interdigital transducers with divided acoustic reflection are arranged on a piezoelectric substrate. The two transducers are made up of groups of fingers.

In a special embodiment (WO 97/10646) [1], interdigital transducers having a tapering structure are composed of groups of fingers each comprising two or three fingers. In cases where three fingers are provided per group of fingers, two of said fingers form a pair of fingers having no reflection, whereas the third finger in a group is a reflector finger. The spacing between the center lines of the reflector finger and the finger of the pair of fingers located adjacent to said reflector finger typically amounts to $3\lambda/8$. ($\lambda$ is the wavelength along a straight line that is associated with the mean frequency, such straight line extending parallel with the collecting electrodes with a preset spacing from one of said collecting electrodes). Each group of fingers consequently has a preferred direction with respect to the generated wave amplitude. A transducer of said type is for that reason a single-phase unidirectional transducer, or abbreviated a SPUDT type transducer. If the width of the reflector finger amounts to $\lambda/4$ or $3\lambda/8$, the groups of fingers are referred to as EWC- or DART-cells. According to the solution [1], the widths of the fingers as a function of the source and/or load impedance are selected in such a manner that the waves reflected on the fingers and regenerated on the source/load impedance compensate each other, so that such a transducer is overall free of reflection. Consequently no interfering echoes occur in spite of adaptation.

In a special embodiment (P. Ventura, M. Solal, P. Dufilié, J. M. Hodé and F. Roux; 1994 IEEE Ultrasonics Symposium Proceedings, pages 1 to 6 [2], the echoes caused as a result of the reflections on the transducers are not only not suppressed, but used for lengthening the pulse response, which results in a lower form factor (corresponding with a greater steepness of the flank) and/or a greater bandwidth. The layouts of surface acoustic wave filters with the same parameters without said properties have to be substantially longer. An optimization method is commonly employed for the determination as to how the acoustic reflections have to be distributed over the transducers in order to obtain the required filter parameters. As the solution according to [2] actually represents a resonator comprising excitation and reflection centers inserted one into another because the echo is usefully included in conceiving the design of the filter, a structural component of said type is referred to as a resonant SPUDT filter (RSPUDT).

The embodiment according to [2] is afflicted with the drawback that the bandwidth of such type of filters is usefully near 1% at the most. It is consequently not possible to realize wideband filters with low insertion damping.

REPRESENTATION OF THE INVENTION

The invention is based on the problem of changing surface acoustic wave filters of the SPUDT-type in such a manner that wideband filters with low insertion damping and a low form factor can be produced without substantially enlarging their layout.

Said problem is solved according to the invention with the surface acoustic wave filter specified in the patent claims.

For solving the problem, provision is made according to the invention for a combination of the following features:

(a) The fingers of each transducer form in their totality a structure that is tapering in the direction of the fingers; and (b) The widths and positions of the fingers are selected in such a manner that the waves reflected on the fingers, together with the waves regenerated by the respective source and load resistance result in a lengthening of the pulse response of the filter that reduces its form factor and/or bandwidth.

The tapering structure can be viewed as a parallel connection of a very high number of narrow filter channels whose transducers differ from each other only by their period length and thus by their mean frequency. Therefore, due to the tapering shape of the structure, a range of mean frequencies is fixed that determines at the same time the bandwidth. The higher the degree of such tapering the greater is the bandwidth. The flank steepness, which determines the form factor, however, can hardly be influenced by the degree of tapering but is primarily determined by the construction of the filter channels. The combination of features as defined by the invention offers the advantage that even with filters having a tapering structure, the echoes can be employed for lengthening the pulse response as if every filter channel and consequently also the entire filter had a substantially greater number of wave sources, or, in other words, as if every filter were substantially longer than the present layout. This advantage is not offered by the solution according to [1] because the echoes are suppressed in each filter channel due to the fact that each transducer channel per se is without reflection, and consequently each transducer, as a whole, is without reflection due to mutual compensation of the reflection and regeneration.

The invention can be realized in a useful manner as described in the following.

Since it is possible that only one single filter channel has to be included that is representative for all filter channels for the determination of the excitation intensities and reflection factors per group of fingers, it is extraordinarily useful due to considerable time savings obtained in the planing stage to design the tapering form in such a manner that not only equivalent finger widths and gap widths are different from one another along two parallel straight lines, but that also the intermediate spaces between two transducers differ from each other by one and the same factor, whereby said lines of all fingers intersect each other in such a manner that in each transducer along said lines, the spacings between the center lines of equivalent fingers are the same in all groups of fingers.

The tapering may be realized in such a way that the width of the fingers and of the gaps between such fingers is reduced in steps. It is useful in this connection if all equivalent corner points of one and the same finger edge are disposed on a curve, whereby the straight-lined extensions of all of said curves of the two transducers each intersect one another beyond the respective finger area in one and the same input.

It is especially useful in this connection if each finger stage contains a rectangular finger section each comprising two vertical or parallel limitations in relation to the spreading direction, whereby the limitations of all finger sections of the same stage extending parallel with the spreading direction each form a straight line of limitation, so that the finger areas located between said two straight lines of limitation in each case represent filter channels that are separated from each other by intermediate areas.

Additional collector electrodes may be arranged in this connection in the intermediate areas in such a manner that if such intermediate areas belong to different transducers, no electrical connection exists in each case between two of said transducers, whereby each additional collector electrode is electrically connected to a collector electrode and the fingers are connected to the additional collector electrodes in such a manner that they have the same electrical potential as if the additional collector electrodes were not present. In the intermediate areas, however, the electrical connection may exist between equivalent finger sections of neighboring filter channels.

All curves on which all equivalent corner points of one and the same finger edge are disposed, may be straight lines, and their extensions beyond the respective finger area of both transducers may be the apparent continuation of said straight lines. The straight-line extensions of the curves beyond the respective finger area may have the direction of the tangent of the respective curve on the borderline of the respective finger area.

A group of fingers may contain two or three fingers. In the latter case, two fingers of each group of fingers may form a pair of fingers, whereby the fingers of a pair of fingers have the same width and are connected to different collector electrodes, and are arranged in relation to one another in such a manner that the pair of fingers is overall without reflection, and that the third finger is in each case a reflector finger. The embodiments are particularly useful if each group of fingers is a DART- or EWC-cell.

The source intensity of the amplitude excitation and a reflection factor may be associated with each group of fingers in the form of a source intensity function and a reflection function, respectively, whereby the source intensity function and the reflection function can be determined with the help of an optimization method.

The reflection function may be designed in such a manner that the reflection factor in at least one group of fingers has the opposite sign vis-à-vis the other groups of fingers. It is useful if said change in the sign is realized in that the spacing of the reflector finger of said one group of fingers from the other reflector fingers amounts to $n\lambda/2 + \lambda/4$, whereby $\lambda$ is the wavelength along a straight line associated with the mean frequency, such line intersecting all fingers in such a manner that all groups of fingers along said line in each transducer are equally wide, and n" is an integer.

For the purpose of adjusting a defined source intensity function it is useful if at least a few groups of fingers, which are designated as structured finger groups, are subdivided in at least one transducer parallel with the collector electrodes in a number of sub-transducers that are electrically connected in series. It is particularly useful in this connection if all sub-transducers of one and the same structured group of fingers have the same aperture.

The number of sub-transducers in at least one structured group of fingers may be different from the number in the other structured groups of fingers.

For the purpose of adjusting a defined source intensity or a defined reflection factor in defined groups of fingers it is useful if the widths of the fingers belonging the respective pair of fingers, or the width of the reflector zinc in at least one group of fingers in at least one transducer are or is different from the widths or width in the other groups of fingers.

The invention is explained in the following in greater detail with the help of an exemplified embodiment and a drawing associated with said embodiment.

SHORT DESCRIPTION OF THE DRAWING

The drawing shows a surface acoustic wave filter comprised of two interdigital transducers, which are arranged on a piezoelectric substrate.

BEST APPROACH FOR REALIZING THE INVENTION

In connection with the acoustic surface wave filter shown in the drawing, the two interdigital transducers 2 and 3 are arranged on a piezoelectric substrate 1. An intermediate space 4 is present between the transducers 2 and 3. The transducer 2 is composed of the collector electrodes 21 and 22 as well as of the finger groups 23, 24 and 25. Said groups of fingers are shown as representative of a substantially greater amount of finger groups actually composing the transducers. In the direction of the collector electrode 22, the fingers of the transducer 2 are forming a tapering structure in the sense of that the width of the fingers and of the gaps between said fingers are reduced in a step-like manner. The finger groups 23, 24 and 25 are EWC-cells. All of the finger groups 23, 24 and 25 structured identically disregarding the varying average inclination of their fingers. For this reason, only the finger group 23 is described in greater detail. Said group of fingers is composed by the reflector finger 231 and the fingers 232 and 233, the latter two fingers jointly forming a pair of fingers.

The transducer 3 is composed of the collector electrodes 31 and 32 as well as of the finger groups 33, 34 and 35. Said groups of fingers are representative of the substantially greater number of finger groups that the transducer 3 actually comprises. The fingers of the transducer 3 are forming a tapering structure in the direction of the collector electrode 32 in the sense that the width of the fingers and of the gaps between said fingers is reduced in a step-like manner. The finger groups 33, 34 and 35 are EWC-cells. All finger groups 33, 34 and 35 have an identical structure disregarding the varying average inclination of their fingers. For this reason, only the finger group 33 is described in greater detail. Said group of fingers is composed of the reflector finger 331 and the fingers 332 and 333, the latter jointly forming a pair of fingers.

The filter is composed of the filter channels 201, 203, 205 and 207. The intermediate areas 202, 204 and 206 are located between the neighboring filter channels 201 and 203; 203 and 205; as well as 205 and 206. The finger sections of neighboring filter channels belonging to one and the same finger are connected with each other in said intermediate areas. The intermediate space 4 located between the transducers 2 and 3 is represented in said filter channels by the intermediate spaces 41, 42, as well as 43 and 44. All finger edges extend parallel with one another. However, equivalent finger edges in different filter channels are displaced against each other in such a manner that the intersection points 208 of the left edges of the equivalent sections of one and the same finger are disposed with the lower line of limitation of the respective filter channel in on and the same straight line. This applies in an analogous manner to the right finger edges as well, where the points 209 have the same meaning as the points 208. Examples of such straight lines are denoted by the reference numerals 210 and 310 in the zone of the transducers 2 and 3, respectively. The average inclination of the edge of a finger is understood to be the inclination of the respective straight line.

The straight lines 210 and 310 are slanted in a manner such that their straight-lined extensions 26 and 36, respectively, intersect one another in one and the same point 5 beyond the respective finger zone. Along the two parallel straight lines 6 and 7, which intersect all fingers of the transducers 2 and 3 in a such a manner that all groups of fingers in each transducer have the same width along said lines, not only the equivalent widths of the fingers and gaps, but also the intermediate spaces 46 and 47 between the two transducers differ by only one and the same factor. In randomly selected filter channels, not only the equivalent widths of the fingers and gaps consequently differ by one and the same factor, but the intermediate spaces 41, 42, 43 and 44 between the two transducers belonging to the selected filter channels vary only by one and the same factor. This property assures that the transmission properties (e.g. the admittance matrix) of all filter channels can be attributed to transmission properties of one single filter channel. This highly reduces the calculation time required for the analysis of a filter according to the exemplified embodiment. Owing to the fact that an optimization process of a filter analysis has to be carried out many times, the determination of the coefficients of the source intensity and the reflection requires not substantially more time with such a method than the comparable procedure carried out in connection with RSPUDT-filters.

All of the fingers 232 and 233; 332 and 333 forming the pairs of fingers, as well as the fingers not shown, which are equivalent to the former, have the same width within one filter channel. All fingers forming a pair of fingers have a spacing of $\lambda/4$ are therefore without reflection, whereby $\lambda$ is the width of a group of fingers in the respective filter channel. However, the reflector fingers 231 and 331, and the fingers that are equivalent to said reflector fingers, but which are not shown, have a varying width in order to realize a defined reflection function. Such reflection function is selected in such a manner that the waves reflected on the reflector fingers, together with the waves regenerated by the corresponding source resistance 8 and the load resistance 9, effect a lengthening of the pulse response of the filter that reduces its form factor and/or bandwidth. The reflection factor of some of the groups of fingers not shown has an opposite sign as compared to the other groups of fingers. This is realized in that the spacing of the reflector fingers in the affected finger groups of the other reflector fingers amounts to $n\lambda/2 + \lambda/4$, whereby n" is an integer. The reflector fingers of the shown finger groups 23, 24, and 25, as well as 33, 34 and 35 have a spacing from each other equal to $n\lambda$. However, if the reflection factor of one of said groups of fingers were negative, the reflector finger of such a group of fingers would have to be shifted by $3/4\lambda$, $5/4\lambda$ or $7/4\lambda$ versus its position in the drawing.

What is claimed is:

1. A surface acoustic wave filter on the basis of interdigital single-phase unidirectional transducers (SPUDT-type), in connection with which two of such transducers are arranged on a piezoelectrical substrate with distributed acoustic reflection, such transducers being composed of groups of fingers and collector electrodes, wherein:
   (a) The electrodes of each transducer form a structure tapering in the direction of the fingers; and
   (b) The structure is tapered in the direction of the fingers so that not only the width of equivalent fingers and gaps, but also the intermediate space between the two transducers only vary by one and the same factor along the parallel straight lines, wherein said lines of all fingers of both transducers intersect one another in such a manner that in each transducer, the spacings of the center lines of equivalent fingers are the same in all groups of fingers.

2. The surface acoustic wave filter according to claim 1, wherein the structure is tapered in the direction of the fingers by reducing the width of the fingers and of the gaps located between said fingers in a step-like manner.

3. The surface acoustic wave filter according to claim 2, wherein all equivalent corner points of a single finger edge are disposed on a curve, and wherein straight-lined extensions intersect of all of said curves of the two transformers and intersect each other beyond the corresponding finger area at a single point.

4. The surface acoustic wave filter according to claim 3, wherein said curves are straight lines and their extensions beyond the corresponding finger area of both transducers are continuations of said straight lines.

5. The surface acoustic wave filter according to claim 3, wherein the straight-lined extensions of the curves beyond the corresponding finger area have the direction of the tangent of the corresponding curve at the borderline of the corresponding finger area.

6. The surface acoustic wave filter according to claim 3, wherein each finger stage contains a rectangular finger section with vertical or parallel limitations in relation to the direction of spreading and wherein the two limitations extending parallel with the direction of spreading of all finger sections of the same stage form a straight line of limitation, so that the finger areas disposed between said two straight lines of limitation represent filter channels separated from each other by intermediate areas (202;-).

7. The surface acoustic wave filter according to claim 6, character further comprising additional collector electrodes disposed in the intermediate areas so that in case such additional collector electrodes belong to different transducers, no electrical connection exists between each two of said additional collector electrodes, whereby each additional collector electrode is electrically connected to a collector electrode and the fingers are connected to the additional collector electrodes so that they have the same electrical potential as if the additional collector electrodes did not exist.

8. The surface acoustic wave filter according to claim 6, wherein electrical connection is made between equivalent finger sections of neighboring filter channels in said intermediate areas.

9. The surface acoustic wave filter according to claim 1, wherein each finger group of both transducers contains two fingers.

10. The surface acoustic wave filter according to claim 1, wherein each finger group of both transducers contains three fingers.

11. The surface acoustic wave filter according to claim 10, character wherein three fingers of each one finger group form a pair of fingers, whereby the fingers of a pair of fingers are equally wide and are connected to different collector electrodes, and are arranged in relation to one another in such a manner that the pair of fingers is without reflection overall and the third finger is in each case a reflector finger.

12. The surface acoustic wave filter according to claim 11, wherein each finger group is a DART-cell.

13. The surface acoustic wave filter according to claim 11, wherein each finger group is an EWC-cell.

14. The surface acoustic wave filter according to claim 11, wherein the source intensity of the amplitude excitation is associated with each finger group by means of a source intensity function.

15. The surface acoustic wave filter according claim 14, wherein the source intensity function and the reflection function are determined by means of an optimization method.

16. The surface acoustic wave filter according to claim 14, wherein at least some of the finger groups, the latter being designated as structured finger groups, are subdivided in at least one transducer parallel with the collector electrodes in a number of sub-transducers which are electrically connected in series.

17. The surface acoustic wave filter according to claim 16, wherein all sub-transducers of one and the same structured finger group leave the same aperture.

18. The acoustic wave filter according to claim 16, wherein the number of sub-transducers in at least one structured finger group is different from the number of sub-transducers in the other structured finger groups.

19. The surface acoustic wave filter according to claim 11, further comprising a reflection factor associated with each finger group by means of a reflection function.

20. The surface acoustic wave filter according to claim 19, wherein the reflection factor in at least one finger group has the opposite sign versus the other groups of fingers, each opposite sign being realized in that the spacing of the reflector finger of said finger group from the other groups of fingers amount to $n\lambda/2 + \lambda/4$, whereby $\lambda$ is the wavelength associated with the mean frequency along a straight line intersecting all fingers in such a manner that in each transducer, all finger groups along said line are equally wide, and that "n" is an integer.

21. The surface acoustic weave filter according to claim 11, wherein the widths of the fingers belonging to a pair of fingers in at least one finger group are different from the widths in the other groups of fingers in at least one transducer.

22. The surface acoustic wave filter according to claim 11, wherein the width of the reflector finger in at least one finger group in at least one transducer is different from the one in the other finger groups.

* * * * *

UNITED STATES PATENT AND TRADEMARK OFFICE
CERTIFICATE OF CORRECTION

PATENT NO.    : 6,707,229 B1
DATED         : March 16, 2004
INVENTOR(S)   : Martin G. Pct It is certified that error appears in the above-identified patent and that said Letters Patent is hereby corrected as shown below:

<u>Column 6,</u>
Line 14, element b, please change "the" to -- two --.
Line 48, please delete the word "character".

<u>Column 7,</u>
Line 2, please delete the word "character".
Line 28, please change the word "leave" to -- have --.

<u>Column 8,</u>
Line 13, please change "+λ4" to -- +λ/4 --.
Line 18, please change the word "weave" to -- wave --.

Signed and Sealed this

Fourth Day of January, 2005

JON W. DUDAS
*Director of the United States Patent and Trademark Office*